(12) United States Patent
Kintis et al.

(10) Patent No.: US 7,162,793 B2
(45) Date of Patent: Jan. 16, 2007

(54) APPARATUS FOR CLAMPING PRINTED CIRCUIT BOARDS INSIDE AN ELECTRONIC MODULE HOUSING

(75) Inventors: Mark Kintis, Manhattan Beach, CA (US); Charles G. Turner, La Habra Heights, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 489 days.

(21) Appl. No.: 10/703,819

(22) Filed: Nov. 7, 2003

(65) Prior Publication Data

US 2004/0093723 A1    May 20, 2004

Related U.S. Application Data

(62) Division of application No. 09/978,341, filed on Oct. 15, 2001, now Pat. No. 6,708,400.

(51) Int. Cl.
*B23P 19/00*    (2006.01)

(52) U.S. Cl. .................. 29/757; 29/281.1; 29/825; 29/830; 29/831; 29/834; 269/266; 361/752; 361/760; 361/797; 361/800; 361/801; 361/802

(58) Field of Classification Search .............. 29/757, 29/281.1, 825, 830, 831, 834; 269/266; 361/752, 361/760, 797, 800, 801, 802
See application file for complete search history.

(56) References Cited

U.S. PATENT DOCUMENTS 4,080,729 A  *  3/1978  Mecklenburg, III .......... 29/834

* cited by examiner

*Primary Examiner*—A. Dexter Tugbang
*Assistant Examiner*—Tim Phan
(74) *Attorney, Agent, or Firm*—Ronald M. Goldman; Scot R. Hewitt

(57) ABSTRACT

Reflow soldering of a variety of circuit boards (9, 11, 15) in a variety of sizes and shapes to assigned locations on the base or carrier (13) of the electronic module housing (3) is simplified by eliminating custom made metal blocks previously used to clamp the circuit boards against the carrier metal. Instead, the solder-backed circuit boards are placed in assigned positions in the module housing and the inside volume of that housing is filled (22) with particulate, such as small beads (17), covering the circuit boards, but leaving the edges of the upstanding metal shields (5 and 7) visible. A plate (21) backed foam sheet (19) is placed over the module housing (24) and clamped down (26), pressing against the beads. The clamped assembly is then heated (28) to reflow the solder, soldering the circuit boards in place.

8 Claims, 3 Drawing Sheets

APPARATUS FOR CLAMPING PRINTED CIRCUIT BOARDS INSIDE AN ELECTRONIC MODULE HOUSING

REFERENCE TO RELATED APPLICATIONS

This application for patent is related to the application of Mark Kintis and Charles G. Turner, entitled, Method of Attaching Printed Circuit Boards within an Electronic Module Housing. U.S. Ser. No. 09/978,341, filed Oct. 15, 2001, now U.S. Pat. No. 6,708,400 and is a divisional of that application. Applicant claims the benefit of 35 U.S.C. §120 with respect to the foregoing application.

FIELD OF THE INVENTION

This invention relates to manufacturing electronic modules, and, more particularly, to a method and apparatus for efficient re-flow solder bonding of multiple populated circuit boards of a variety of different sizes and thickness within respective compartments in the module housing carrier, without use of custom-made clamping blocks.

BACKGROUND

Electronic equipment is often modularized, particularly that in the field of RF communication and at microwave frequencies and higher. That is, various electronic circuits are packaged together in a module and the module fits within (and is inserted into) a rack or other cabinet, alongside other modules, which collectively form an electronic system. Each module contains electrical connectors that plug into mating connectors in the rack or cabinet, enabling the various modules to communicate with other circuits in other modules via transmission lines in the respective rack or cabinet, and/or receive electrical power for operation. Typically, the module is constructed of a strong shallow rectangular metal frame, somewhat resembling a picture frame in appearance, and containing top and bottom metal walls, referred to as the cover and the carrier, that fasten to the frame and cover the rectangular window-like openings on top and bottom sides. Collectively, the foregoing frame and other components are often referred to as the module housing.

The metal walls and frame of the module housing shield the electronic circuitry inside the module from outside RF interference and, conversely, prevent RF from escaping from the module and causing interference with external apparatus. The housing carrier or wall also serves as a thermal transmission path, allowing heat from the circuit boards, internally generated inside the module housing, to pass to a heat sink or otherwise dissipate in the environment.

The module houses a variety of populated printed circuit boards carrying the electronic circuits that together defines the purpose of the particular module in the electronic system. Those circuit boards, populated with electronic chips and other electronic components, are placed in positions about the available space in the rectangular area on the carrier wall inside the module housing that are assigned by the circuit designer. Since the electronic functions of the circuit boards typically differ from one another, individual circuit boards may vary in size and height, but all fit within the available space on the module housing carrier and within the internal volume of the module housing.

With the top wall or cover of the module housing removed, the inside region appears compartmentalized, a second physical characteristic of the internal region. The inside region is divided by a variety of metal walls upstanding from the bottom wall and the individual circuit boards fit inside respective regions defined by two or more associated metal walls. The upstanding walls may appear in a variety of lengths and some contain bends, producing open and/or closed compartments in a variety of sizes. The metal walls are attached to and extend from the bottom carrier wall up to the plane of the inner surface of the top cover so that, with the top wall, the module cover, fastened in place, the upstanding walls, cover and bottom carrier define a number of metal three-dimensional cavities or regions, each of which contains a circuit board that is populated with electronic components or microstrip lines.

The upstanding metal walls of the module serve as RF shielding to prevent RF energy as may be generated in and radiated from a given circuit board from propagating to another circuit board by an undesired route that could cause improper functioning of the electronic circuits or render the electronic circuits dysfunctional. The complexity and variety of two-dimensional shapes defined by the internal walls inside a typical module is visible in the isometric view of a typical module presented in FIG. 1, which may be inspected briefly.

As those skilled in the art recognize, individual circuit boards are typically fastened to the bottom wall of the module by solder, which holds the respective boards in place and places the electrical ground of the circuit board in common with the metal walls of the module housing. The bottom side of each printed circuit board, which may be a laminate, contains a metal outer surface, typically a solder coating. That metal outer surface is pre-tinned as required by the conventional solder reflow process. By pressing the circuit board against the metal bottom wall of the module and re-flowing the solder, that is, heating the solder (and other components in the vicinity) to the eutectic temperature of the solder, after which the heat is removed, the solder resolidifies and bonds the printed wiring board in place. This last briefly summarized step is one that produces the greatest expense and effort in the assembly process, which the present invention addresses and improves upon.

In existing practice pressing a circuit board against the bottom wall of the module during the solder reflow process requires use of a metal block, often formed of titanium or aluminum. The circuit board is clamped between the metal block and the metal wall and then heat is applied. With many circuit boards in a module, there must be many blocks, all of which are clamped for the solder reflow process.

The metal block must fit in the space occupied by the associated circuit board, and between any of the upstanding metal walls adjoining the respective circuit board. The metal block must also be of sufficient height to reach the top of the module and be accessible to the clamp. As earlier explained (and as is apparent from FIG. 1) each of the compartments of the module's real estate may be of a different size and shape. Hence, the associated metal block for a respective region must be individually machined to shape. A typical module may require thirty or more individually machined metal clamping blocks. Thus, once the layout of the module is finalized by the module designer and ready for manufacture, the manufacturing engineers must prescribe the size of the blocks needed for the manufacturing process.

The blocks need to be machined to shape, typically to tolerances of thousandths of an inch. As those skilled in the art appreciate the fabrication of the metal blocks is a time consuming procedure and makes manufacturing set-up expensive. Moreover, since volume manufacturing of communications equipment using such modules may be limited, the cost of the foregoing set up on a per unit basis is quite high. Since an electronic system contains a number of different modules of different function, and, hence, possess different layouts, a great many different metal blocks must be machined to shape, perhaps hundreds of such blocks. And pity the engineer who determines that it is necessary to change the layout once the electronic module design has been released for manufacture.

A principal reason for using a clamping procedure during the solder reflow process is to ensure that the entire bottom surface of each circuit board is soldered to the metal wall, particularly around the edges of the circuit board. As example, should the side edge of a circuit board be uplifted from the board due to ineffective soldering, leaving a gap, the gap increases the length of the ground path to the next circuit board in the electronic circuit in the module. If the RF output from the circuit board is propagating a high frequency microwave signal to an adjacent microstrip line or another circuit board, as example, the ground path for return current is increased, undesirably introducing attenuation of the signal. Moreover, due to the metal sides of the wall and circuit board, the gap forms a microwave cavity that may be resonant at the frequency of RF being propagated from the circuit board, which may result in oscillations or signal path power losses.

Use of metal blocks is also slightly disadvantageous to the solder reflow process. Since the metal block is heat transmissive, the block conducts heat away from the solder, requiring more heat be applied than otherwise.

As an advantage, the present invention obsoletes metal clamping blocks and renders those blocks unnecessary for the solder reflow process in module fabrication. The printed circuit boards may be solder bonded to the bottom wall of the module by reflowing the solder by pressing the printed circuit board against that wall and reflowing the solder, but without use of metal clamping blocks.

Accordingly, an object of the invention is to enhance the efficiency of the process of manufacturing electronic modules and reduce manufacturing cost.

A further object of the invention is to reduce the time and cost of set-up required for the manufacture of electronic modules, and, more specifically for reflow soldering of circuit boards in place in the module housing.

And a still further object of the invention is to press printed circuit boards against the metal surface during reflow soldering of those circuit boards to the metal surface without using metal clamping blocks.

SUMMARY OF THE INVENTION

In accordance with the invention, solder-backed circuit boards are placed in assigned positions on the carrier metal and then the inside volume of the electronic module housing is filled to the top with particulate, such as small beads, while leaving the edges of any upstanding metal shields in the inside volume visible. A plate backed sheet of foam material, e.g. a foam sheet, is placed over the module housing and is then clamped down, pressing against the particulate, and, through the particulate, pressing the confined circuit boards against the carrier metal. The clamped assembly is then placed in a heating chamber or other reflow processing station and is heated to reflow the solder on the back of the circuit boards. The heating is withdrawn and the assembly is allowed to cool down, completing the reflow soldering. The particulate is removed from the housing interior (and may be reused), completing the soldering process.

In accordance with a more specific aspect of the invention the particles of the particulate are glass spheres. And, in accordance with a further specific aspect of the invention, the particulate is of material that is no better than poor in thermal conductivity.

The foregoing method allows soldering of a variety of circuit boards of a variety of size and shape to assigned locations on the base or carrier metal of the electronic module to be completed all at once. By eliminating custom made metal blocks previously used to clamp the circuit boards against the carrier metal the complex and expensive work to fabricate those metal blocks to shape in setting up for solder reflow processing is avoided; and the assembly of circuit boards to the electronic module housing is greatly simplified.

The foregoing and additional objects and advantages of the invention, together with the structure characteristic thereof, which were only briefly summarized in the foregoing passages, will become more apparent to those skilled in the art upon reading the detailed description of a preferred embodiment of the invention, which follows in this specification, taken together with the illustrations thereof presented in the accompanying drawings.

DETAILED DESCRIPTION OF THE PREFERRED EMBODIMENTS

Figure 1:
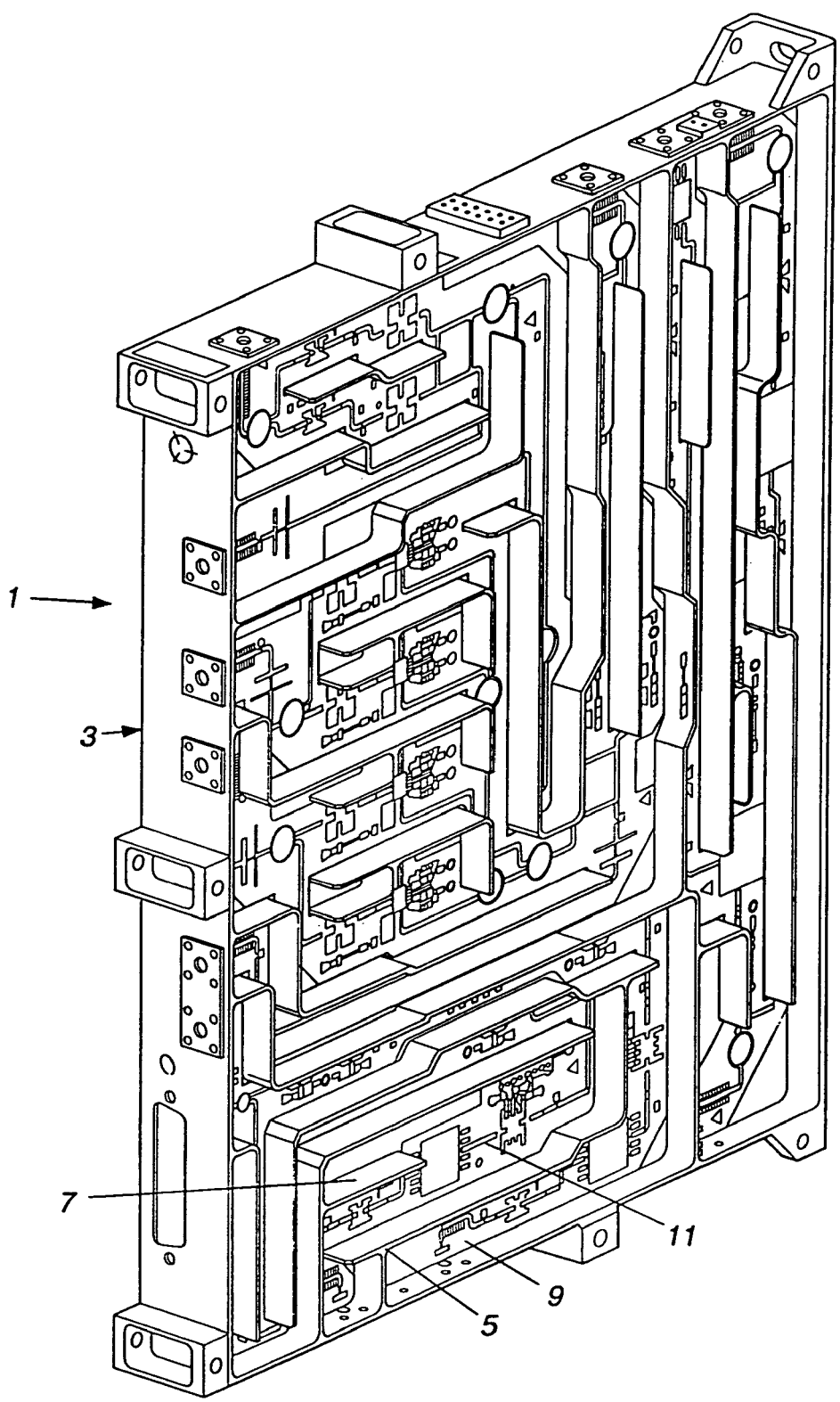
FIG. 1 is an isometric view of an electronic module with the cover of the module housing removed to expose the general internal structure of the module and the contents of the interior volume.

Reference is first made to FIG. 1, which provides an isometric view of a module 1 that is typical of the prior art construction, it being understood that the product produced by the practice of the invention is the same as the prior art. The module, shown raised in a vertical position, contains a housing 3 formed of a generally narrow rectangular metal frame, defining a relatively large rectangular region, a metal bottom wall or, as variously termed carrier, not visible in the figure, located on the far side of the housing that covers the large rectangular region from the opposite side or underside. A metal cover panel, not illustrated, that closes the open end of the housing, is removed so that the internal contents of the module housing may be viewed. For purposes of this description the open or uncovered side of the module is referred to as the top or upper side, and the carrier or bottom wall is referred to as the bottom side of the housing. As one appreciates, a completed module may be mounted in a rack, either horizontally or vertically. Even if mounted vertically as shown in the figure, it should be understood that the right side of the module housing in the figure is being referred to herein as the top or upper side for reasons which become more apparent later in this description.

The inside of housing 3 contains a large number of metal walls, such as 5 and 7, only two of which are identified by number. Those walls divide the internal rectangular region of the housing into various compartments, some of which may be open, and others closed. The metal walls are attached to or are formed integrally in the bottom carrier of the housing and are of a height that extends to the plane defined by the housing edges at the upper end of the housing. That permits the top edge of the walls to contact the metal surface of the cover for the best possible RF shielding between compartments.

Each compartment contains a circuit board that is sized to fit into the compartment specified by the designer, an assigned location, such as circuit boards 9 and 11, only two of which are identified by number. The compartments (and the associated circuit boards) define sub-regions of odd sized generally rectangular shaped areas in a variety of sizes and shapes. As was earlier described in the background to this description, those sizes and shapes are dictated by the necessities of the functional and mechanical design of the electronic module.

As described in the background the circuit boards are pretinned for soldering and are placed in the assigned compartments. In the prior method for soldering those boards, the custom fabricated metal blocks are inserted into the respective assigned compartments, and are clamped against the circuit boards, forming an assembly that is then introduced into the heating of the conventional solder reflowing process. Although the illustration serves as background to the process described hereafter, one readily appreciates the enormous complexity, time and expense involved in preparing the many different metal blocks for the prior art soldering process for just this single module.

Figure 2:
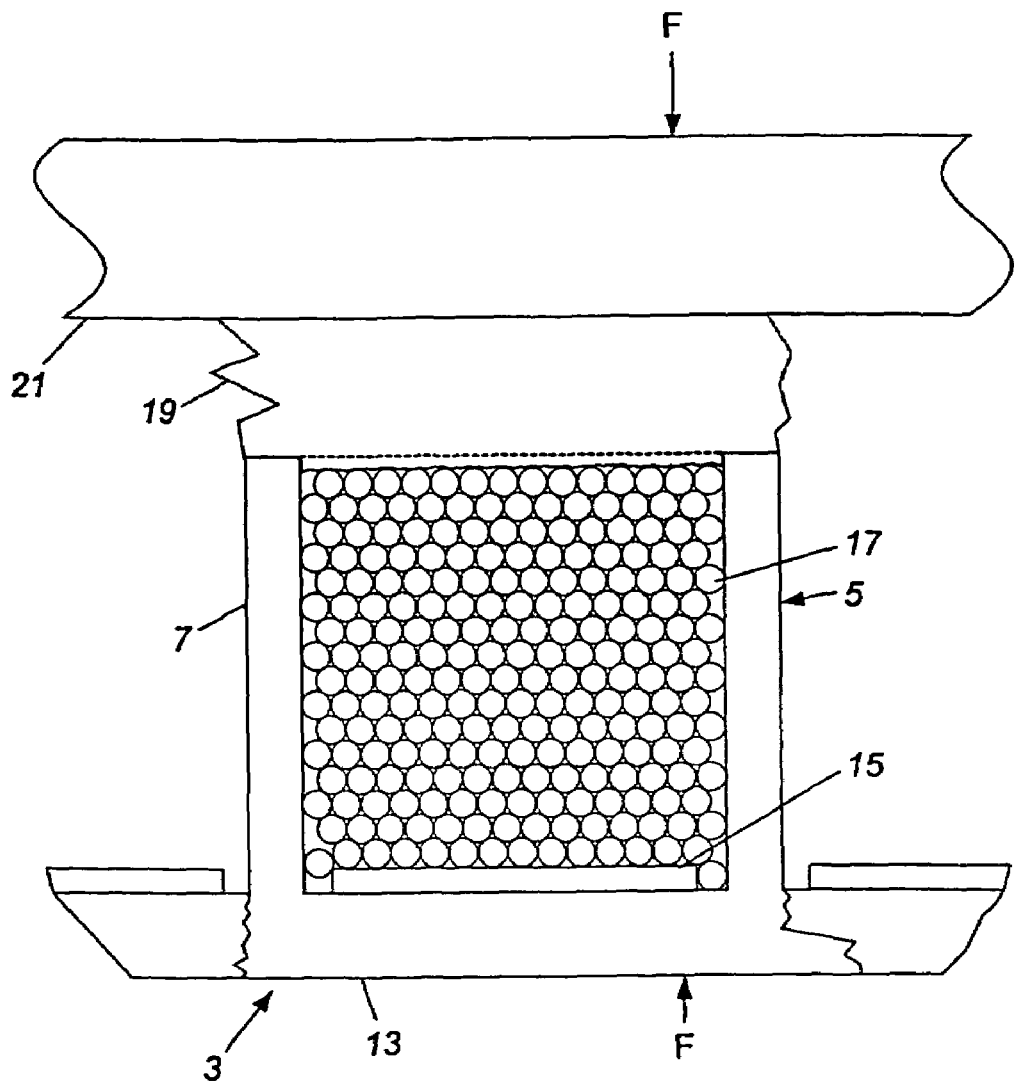
FIG. 2 is a side section view of the principal apparatus used to accomplish the invention.

Reference is made to the partial section view of FIG. 2, which shows the principal components used to practice a preferred embodiment of the method invention and the relationship of those components to the module housing and circuit boards during the reflow soldering process. The bottom carrier 13 of module housing 3, partially illustrated, is shown supporting two of the upstanding metal walls, 5 and 7, that form a compartment within the housing. A circuit board 15 is disposed in place in the assigned compartment defined in part by walls 5 and 7, ready for the reflow soldering process that solders that circuit board to the bottom carrier 13.

Small spheres or spheroids 17, referred to herein as beads, overlie circuit board 15 and fill the formed compartment, up to the top edge of the upstanding compartment-defining walls, such as walls 5 and 7. A sheet 19 of a compressible material, commonly referred to as high temperature gasket material, or other like material, partially illustrated (and sometimes referred to herein as foam material), is placed over the top end of the module housing. That sheet of compressible material is backed (or overlain) by another sheet or plate 21 of more rigid material, such as an aluminum plate 21.

A clamp, not illustrated, provides a clamping force to the formed sandwich of components. By applying a squeezing or clamping force, F, between the aluminum plate 21 and bottom carrier 13, foam sheet 19 is pressed against the edges of walls 5 and 7, and yields or compresses along those edges, while the other portions of the foam sheet, located between the walls, presses against beads 17. In doing so, a portion of the foam sheet overlying the area between the walls protrudes slightly into the formed compartment. As one appreciates, although the foam sheet is sufficiently compressible and gives in regions thereof pressed against the edges of the relatively thick strong metal walls the foam is sufficiently rigid so as not to give significantly under the reactive force exerted by the beads, and holds the beads under pressure. Responding to the clamping force, beads 17 distribute evenly and apply pressure evenly over the entire circuit board 15 and particularly the edges of the circuit boards where soldering is most critical.

Although only a portion of the module housing and a single internal compartment is illustrated in FIG. 2, it should be realized that the beads fill all compartments within the module housing and that the metal backed foam sheet covers the entire upper end of module housing 3. Hence what is illustrated in FIG. 2 is repeated over the entire inside of the module housing, and the clamping action described, occurs in all compartments concurrently.

Figure 3:
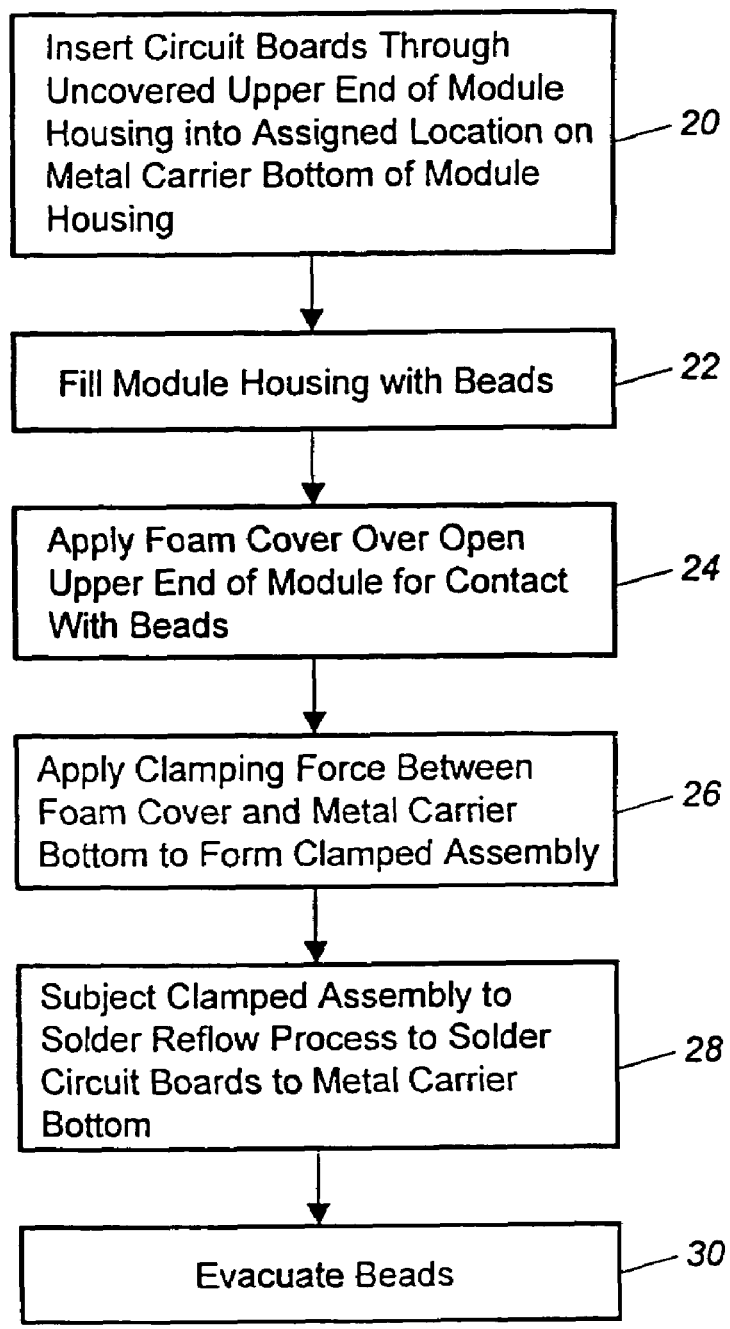
FIG. 3 is a process diagram of the new method that incorporates the apparatus of FIG. 2.

Although the invention should become evident from the foregoing description, for completeness reference is made to FIG. 3, which illustrates the steps of the circuit board mounting process. Assuming one is given a module housing and the circuit boards for that housing, a first step is to place the circuit boards through the uncovered upper end of the housing and into the assigned locations on the carrier bottom inside the module housing, as illustrated at 20. Next beads are deposited inside the module until the entire inside is filled with the beads as represented at 22. A straight spatula, like a cake spatula, may be wiped across the upper edge of the housing to ensure that the glass beads do not form a mound at any particular location or deposit on the top edge of any of the internal upstanding shielding walls.

The metal plate backed foam sheet is then placed on top of the module to cover the open end, as represented at 24, and a clamping force is applied between the metal plate and the bottom carrier of the housing as at 26 to form a clamped assembly, thereby squeezing the beads against the circuit board and holding the circuit board flat against the bottom carrier. The clamped assembly is then placed in a heating chamber for reflow soldering as at 28. Reflow is conventional in operation. The heat causes the solder on the rear side of the circuit board to attain the eutectic temperature and the solder melts and flows into the interstices in the adjoining metal of the bottom carrier. Thereafter the heating is terminated (or the clamped assembly is removed from the oven) and the clamped assembly is permitted to cool down, whereby the solder resolidifies and produces an attachment between the circuit boards and the carrier.

Once cooled, it is desirable to remove the beads from the module housing. The beads may be evacuated by a vacuum apparatus, essentially a vacuum cleaner that draws out the beads and deposits them in a container, from which the beads can later be retrieved and reused. If necessary, any remnants of beads found after vacuuming may be removed by brushing them out or agitating the housing and dumping them out. Any residue from the beads may be removed by conventional solvent cleaning. The foregoing concludes the process. For completion of the electronic module, the cover is installed in place to cover the open end.

Reference is again made to FIG. 2. Beads 17 in this embodiment are small spheres or spheroids in shape, are sufficiently rigid to withstand the clamping force exerted by the foam sheet without significant deformation, and are capable of withstanding the effects of the incident heating encountered in the solder reflow operation without significant deformation or conduction of heat. Preferably the bead material should also be a relatively poor thermal conductor according to industry standards, that is, poor relative to other materials that may satisfy the preceding characteristics. The poor thermal conductivity minimizes escape of heat from the circuit board during reflow soldering (e.g., heating) that could interfere with soldering. The foregoing reference to a poor thermal conductor is understood to include within the meaning of that term a thermal non-conductor, which is the ideal. Preferably, the material that forms the beads should also be inorganic, so as not to adversely affect the circuit board. At present, glass is the preferred material, and, more specifically borosilicate glass, such as manufactured by the MO-SCI Corporation. As those skilled in the art appreciate other materials may be substituted.

The beads should be small enough in diameter relative to the cavity so that a large number of beads is necessary to cover the surface of the circuit board. In that way the beads should distribute the clamping force more evenly over the surface of the associated printed circuit boards. In one practical embodiment the beads are 0.10 inches in diameter.

In one practical embodiment foam sheet 19 may be constructed from an expanded silicone elastomer material marketed by the Boyd Corporation and may be approximately one-half inch (1.27 cm) thick. In an alternative construction in which a more stiff foam material is desired, that might not easily compress against the edges of the upstanding walls 5 and 7, then the foam sheet should be modified to include grooves of a predetermined depth. For such an alternative a layout is made of all of the walls contained within the module. The foam sheet is then grooved in the image of that wall layout to a short depth. The outer dimensions of the foam sheet are such as to fit within the outer walls of the housing. Then when the sheet is overturned and aligned so that the grooves receive the edges of the walls, such as 5 and 7, the sheet may be pressed against the beads without having to overcome the resistance of the wall edges.

The invention is not to be construed in a limited sense. As those skilled in the art appreciate from an understanding of the foregoing description, the invention is not limited to the shape and material of the beads, the particles of the particulate used in the foregoing embodiment. Spheres and glass are at present the preferred shape and material, since glass spheres may be easily manufactured at reasonable cost. It should be clear that other shapes, as example, spheroidal or ellipsoidal, may be substituted. Further, whatever shape is chosen for the particulate, the particle may be made of glass or other material having the low thermal conductive or non-conductive property described earlier. Even pebbles or rice-shaped particles of borosilicate glass could be used in alternative embodiments of the method. All such shaped materials appear to function in the described method as equivalents.

As the reader should appreciate, the term selected as generic to all such beads is "particulate". Webster's New Collegiate dictionary defines particulate as being "of or relating to minute separate particles", and defines a particle as "a relatively small . . . discrete portion of something". Thus, as used herein, the term particulate subsumes all possible shapes found to function in the described process to produce the described result.

It is believed that the foregoing description of the preferred embodiments of the invention is sufficient in detail to enable one skilled in the art to make and use the invention without undue experimentation. However, it is expressly understood that the detail of the elements comprising the embodiment presented for the foregoing purpose is not intended to limit the scope of the invention in any way, in as much as equivalents to those elements and other modifications thereof, all of which come within the scope of the invention, will become apparent to those skilled in the art upon reading this specification. Thus, the invention is to be broadly construed within the full scope of the appended claims.

What is claimed is:

1. Clamping apparatus for clamping a plurality of circuit boards to the carrier wall in the inside region of the housing of an electronic module during reflow solder processing to attach said circuit boards to said carrier wall, said inside region including metal walls upstanding from said carrier wall and defining a plurality of compartments, each respective compartment being the location for at least a respective one of said plurality of circuit boards, comprising:

a particulate, said particulate being sufficient in number to fill said housing and cover said plurality of circuit boards without covering said upstanding metal walls of said inside region of said housing;

a sheet of foam material, said sheet being sufficient in size to cover an open end of said housing;

a rigid plate, said rigid plate being sufficient in size to cover said sheet of foam material; and clamping means for applying a compressive force between said carrier wall and said rigid plate to compress said sheet of foam material against said particulate and force said plurality of circuit boards against said carrier wall for reflow soldering of said circuit boards to said carrier wall.

2. The clamping apparatus as defined in claim 1, wherein said particles of said particulate comprise spheres.

3. The clamping apparatus as defined in claim 2, wherein said spheres comprise borosilicate glass and wherein said foam material comprises an expanded silicone elastomer.

4. The clamping apparatus as defined in claim 1, wherein said foam material comprises a high temperature gasket material.

5. The clamping apparatus as defined in claim 1, wherein said sheet of foam material includes a surface containing of grooves, said plurality of grooves arranged in the mirror image of the upper most edge of said upstanding metal walls for respectively receiving said upper most edge of said upstanding walls.

6. The clamping apparatus as defined in claim 1, wherein said sheet of foam material is compressible.

7. The clamping apparatus as defined in claim 1, wherein said sheet of foam material is compressible and includes a surface containing a plurality of permanent grooves, said plurality of grooves arranged in the mirror image of the upper most edge of said upstanding metal walls for respectively receiving said upper most edge of said upstanding metal walls to permit said sheet of foam material to compress against said particulate without interference of said upstanding metal walls.

8. Clamping apparatus for clamping a plurality of circuit boards to the carrier wall in the inside region of the housing of an electronic module during reflow solder processing to attach said circuit boards to said carrier wall, said inside region including metal walls upstanding from said carrier wall and defining a plurality of compartments, each respective compartment being the location for at least a respective one of said plurality of circuit boards, comprising:

a particulate of borosilicate glass beads, said particulate being sufficient in number to fill said housing and cover said plurality of circuit boards without covering said upstanding metal walls of said inside region of said housing;

a sheet of foam material, said sheet being sufficient in size to cover an open end of said housing and comprising an expanded silicone elastomer;

a rigid plate to overlay and cover said sheet of foam material; and clamping means for applying a compressive force between said rigid plate and said carrier wall to compress said sheet of foam material against said particulate and force said plurality of circuit boards against said carrier wall for reflow soldering of said circuit boards to said carrier wall, said sheet of foam material being compressible and includes a surface containing a plurality of permanent grooves, said plurality of permanent grooves being arranged in the mirror image of the upper most edge of said upstanding metal walls for respectively receiving said upper most edge of said upstanding metal walls to permit said sheet of foam material to compress against said particulate without interference of said upstanding metal walls.

\* \* \* \* \*